United States Patent
Palani et al.

(10) Patent No.: US 10,742,229 B2
(45) Date of Patent: Aug. 11, 2020

(54) DYNAMIC ELEMENT MATCHING

(71) Applicant: Maxlinear, Inc., Carlsbad, CA (US)

(72) Inventors: Rakesh Kumar Palani, Irvine, CA (US); Suman Sah, Colorado Springs, CO (US)

(73) Assignee: MAXLINEAR, INC., Carlsbad, CA (US)

(*) Notice: Subject to any disclaimer, the term of this patent is extended or adjusted under 35 U.S.C. 154(b) by 0 days.

(21) Appl. No.: 16/403,812

(22) Filed: May 6, 2019

(65) Prior Publication Data
US 2019/0341927 A1 Nov. 7, 2019

Related U.S. Application Data

(60) Provisional application No. 62/667,755, filed on May 7, 2018.

(51) Int. Cl.
*H03M 1/66* (2006.01)
*G06F 7/58* (2006.01)
*H03M 7/16* (2006.01)

(52) U.S. Cl.
CPC ............ *H03M 1/662* (2013.01); *G06F 7/582* (2013.01); *H03M 7/165* (2013.01)

(58) Field of Classification Search
CPC ...... H03M 1/662; H03M 7/165; H03M 1/747; G06F 7/582
USPC .............................................. 341/144, 50, 51
See application file for complete search history.

(56) References Cited

U.S. PATENT DOCUMENTS

| | | | | |
|---|---|---|---|---|
| 6,373,424 B1* | 4/2002 | Soenen | ............... | H03M 1/0673 341/118 |
| 6,466,153 B1* | 10/2002 | Yu | ...................... | H03M 1/0673 341/120 |
| 6,545,623 B1* | 4/2003 | Yu | ...................... | H03M 1/0673 341/154 |
| 7,417,877 B2* | 8/2008 | Leung | ................... | H02M 3/157 323/282 |
| 7,640,455 B2* | 12/2009 | Leung | ................... | H02M 3/157 323/283 |
| 9,002,915 B1* | 4/2015 | Young | .............. | H03K 19/17736 708/209 |
| 9,172,395 B2* | 10/2015 | Liu | ......................... | G06F 17/22 |
| 9,407,281 B1* | 8/2016 | Tsang | ................... | H03M 1/067 |
| 2002/0039079 A1* | 4/2002 | Shimura | ............ | G07C 9/00182 341/176 |

* cited by examiner

Primary Examiner — Jean B Jeanglaude
(74) Attorney, Agent, or Firm — Maschoff Brennan (57) ABSTRACT

A system includes an input shuffling circuit and digital-to-analog conversion circuitry. The input shuffling circuit includes a data input, a data output, and a control input. The input shuffling circuit is operable to receive, via the data input, an N-bit binary value, where N is an integer. The input shuffling circuit is operable to route each of the N bits of the N-bit binary word to one or more of M bits of the data output to generate an M-bit value, where M=2N, and the routing is based on a control value applied to the control input. The input shuffling circuit can be configured either in a dynamic element matching (DEM) mode or a regular binary to thermometer mode. The digital-to-analog conversion circuitry is operable to convert the M-bit value to a corresponding analog voltage and/or current. M different values of the control value may result in M different routings of the N bits of the binary word.

20 Claims, 6 Drawing Sheets

DYNAMIC ELEMENT MATCHING

PRIORITY CLAIM

This application claims priority to U.S. provisional patent application 62/667,755 titled "Dynamic Element Matching," which was filed on May 7, 2018 and is hereby incorporated herein by reference in its entirety.

BACKGROUND

Limitations and disadvantages of conventional and traditional approaches to dynamic element matching will become apparent to one of skill in the art, through comparison of such systems with some aspects of the present invention as set forth in the remainder of the present application with reference to the drawings.

BRIEF SUMMARY OF THE INVENTION

A system and/or method is provided for dynamic element matching, substantially as shown in and/or described in connection with at least one of the figures, as set forth more completely in the claims.

Advantages, aspects, and novel features of the present invention, as well as details of an illustrated embodiment thereof, will be more fully understood from the following description and drawings.

DETAILED DESCRIPTION OF THE INVENTION

Aspects of this disclosure provide a dynamic element matching circuit architecture that can be reconfigured to a Binary to Thermometer converter easily by changing just the control bits. In one mode the architecture can be used to rotate input in any fixed configuration (e.g., a thermometer-coding configuration, a binary-coding configuration, etc.) and in another mode can be used to rotate the input dynamically to provide dynamic element matching.

Figure 1:
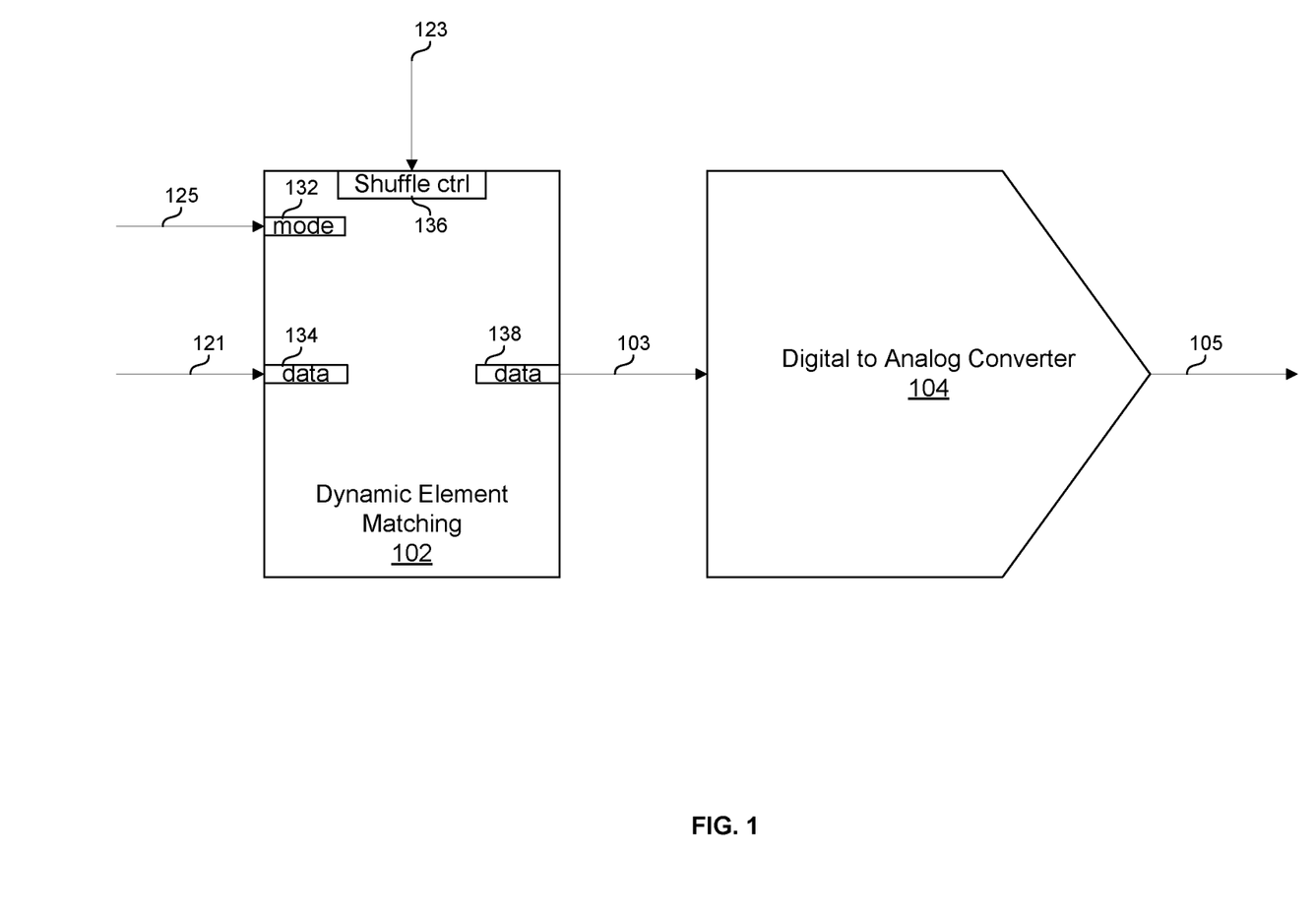
FIG. 1 shows an example digital-to-analog converter (DAC) preceded by a dynamic element matching and binary to thermometer converter (DEM/BTT) circuit.

FIG. 1 shows an example digital-to-analog converter (DAC) preceded by a dynamic element matching and binary to thermometer (DEM/BTT)) circuit. In FIG. 1, digital signal 121 is to be converted to corresponding analog signal 105.

The DAC 104 comprises circuitry (e.g., a plurality of unary-coded analog elements such as resistors and MOS transistors) operable to convert the digital signal 103 to a corresponding analog signal 105. The DAC circuitry 104 comprises a plurality of analog elements (e.g., MOS transistors) that, due to process variations, have some amount of mismatch (static and/or timing mismatch). If not mitigated, such mismatch could lead to nonlinearity and/or other effects that increase distortion of the signal 105.

The DEMBTT 102 circuit comprises a data input 134, a mode control input 132, a shuffle control input 136, and a data output 138. In operation, the digital signal 121 to be converted to analog is applied to data input 134 and the DEMBTT circuit 102 generates a corresponding signal 103 at data output 138 based on the state of mode select signal 125 and shuffle control signal 123.

Figure 4:
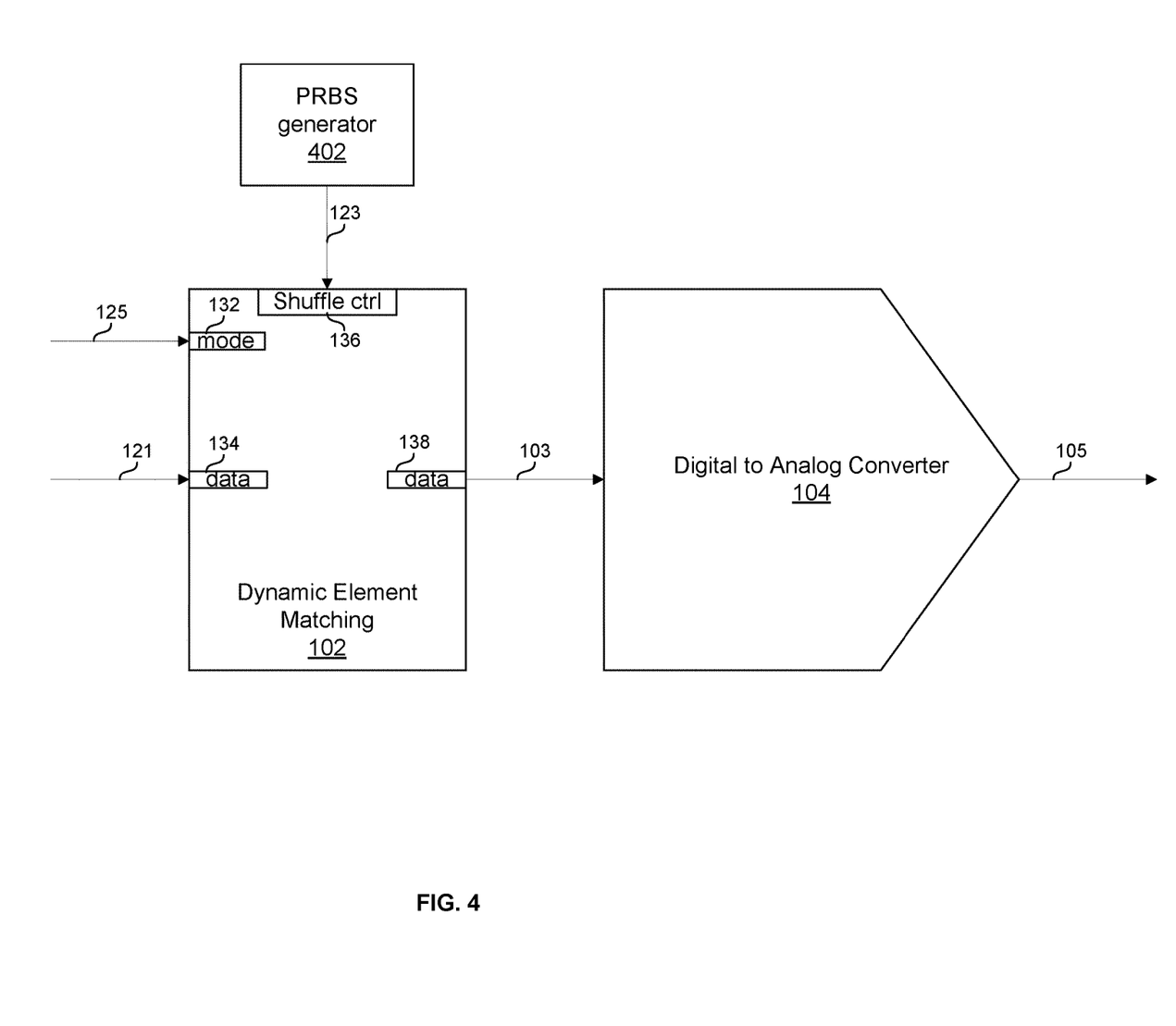
FIG. 4 illustrates the shuffle control input of the DEM/BTT being driven by a pseudo random binary sequence generator.

In an example implementation, when mode select signal 125 is in a first state (e.g., digital '0') then the DEM/BTT circuit 102 attempts to mitigate the effects of mismatch within the DAC 104 by shuffling (e.g., randomly or pseudorandomly) which elements of the DAC 104 process which bits of the data signal 121 such that, on average over time, each bit is affected equally by the mismatch, reducing the distortion in the analog signal 105. In this mode, the shuffling is controlled by the control signal 123 (e.g., a pseudorandom digital sequence generated by pseudorandom binary sequence (PRBS) generator 402 of FIG. 4). When the mode select signal 125 is in a second state (e.g., digital '1') the circuit 102 operates as a binary to thermometer converter.

Figure 2:
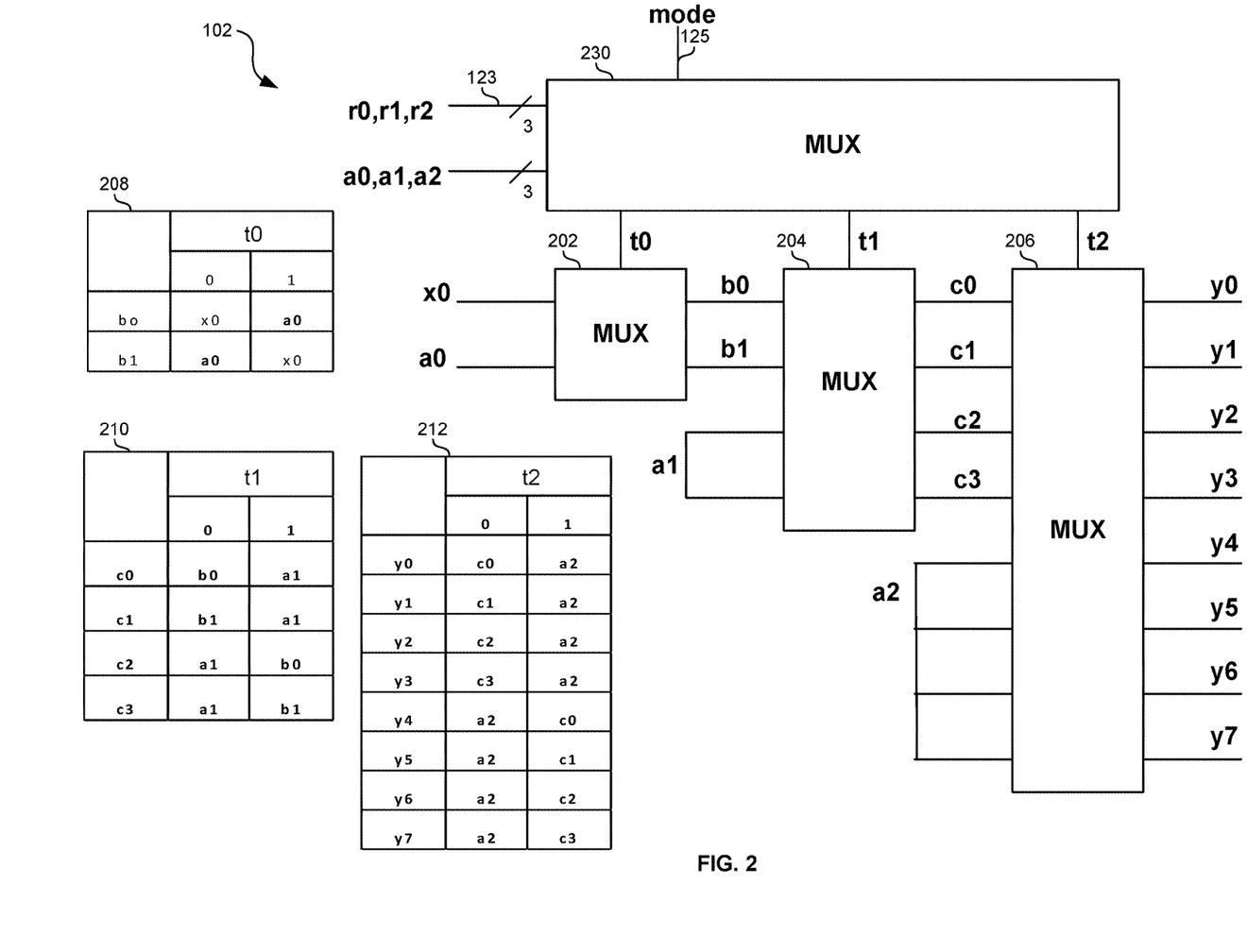
FIG. 2 shows a dynamic element matching circuit in accordance with an example implementation of this disclosure.

FIG. 2 shows a dynamic element matching circuit in accordance with an example implementation of this disclosure. The DEM circuit 102 comprises multiplexers 202, 204, 206, and 230.

Although an 8-bit DEM circuit 102 is shown, aspects of this disclosure are applicable to different bit widths. A 16-bit DAC, for example, may comprise an additional Mux with 16 inputs/outputs where the top 8 inputs are connected to the output of the 8-bit DEM circuit shown and the lower 8 inputs are connected to input bit a3.

Multiplexer 230 comprises circuitry operable to route signals between six inputs (shown as two 3-bit busses) and 3 outputs t0, t1, and t2. When mode select signal 123 is in a first state (e.g., binary '0')—putting the circuit 102 is in DEM mode—then the pseudorandom values r0, r1, and r2 are routed to t0, t1, and t2, respectively. When mode select signal 125 is in a second state (e.g., binary '1')—putting the circuit 102 is in binary-to-thermometric conversion mode—then the input values a0, a1, and a2 are routed to t0, t1, and t2, respectively.

Multiplexer 202 comprises circuitry operable to route signals between two inputs and two outputs. The first input is connected to signal x0, and the second input is connected to signal a0. In an example implementation, x0 is either a constant '0' or constant '1.' In DEM mode the x0 complement will be subtracted from the DAC output with an additional element to avoid any dc component. In BTT mode the bit y0 is ignored and only bits y1 to y7 are used as thermometer bits in DAC. The two outputs of mux 202 are b0 and b1. The multiplexer 202 routes each of x0 and a0 to one of b0 and b1 based on the state of t0 as shown in table 208 of FIG. 2. Multiplexer 202 may comprise any suitable arrangement of passive and/or active devices for realizing the logic of table 208.

Multiplexer 204 comprises circuitry operable to route signals between four inputs and four outputs. The first input is connected to signal b0, and the second input is connected to signal b1. The third and fourth inputs are both connected to signal a1. The four output signals are c0 through c3, respectively. The multiplexer 204 routes b0, b1, and a1 among c0 through c3 based on the state of t1, as shown in table 210 of FIG. 2. Multiplexer 204 may comprise any suitable arrangement of passive and/or active devices for realizing the logic of table 210.

Multiplexer 206 comprises circuitry operable to route signals between eight inputs and eight outputs. The first input is connected to signal c1, the second input is connected to signal c1, the third input is connected to signal c2, and the fourth input is connected to signal c3. The fifth through eighth inputs are all connected to a2. The first through eighth outputs output signals y0 through y7, respectively. The multiplexer 206 routes each of c0 through c3 and a0 to one or more of y0 through y7 based on the state of t2, as shown in table 212 of FIG. 2. Multiplexer 206 may comprise any suitable arrangement of passive and/or active devices for realizing the logic of table 212.

The signals y0-y7 correspond to signal 103 output to the DAC 104 in FIG. 1. Thus, the example DEM circuit 102 converts from 3-bit binary values comprising bits a0, a1, a2 to 8-bit values comprising bits y0, y1, ... y7. The output of the DAC 104 is then proportional to the number of 1's in y0-y7.

In DEM mode, bits r0, r1, r2 being random or pseudorandom results in randomly or pseudorandomly shuffling which bits are processed by which circuit elements. The bits r0, r1, r2 may be changed at a rate that is less than, the same as, or greater than the rate at which the data bits a0, a1, a2 change.

Figure 3A:
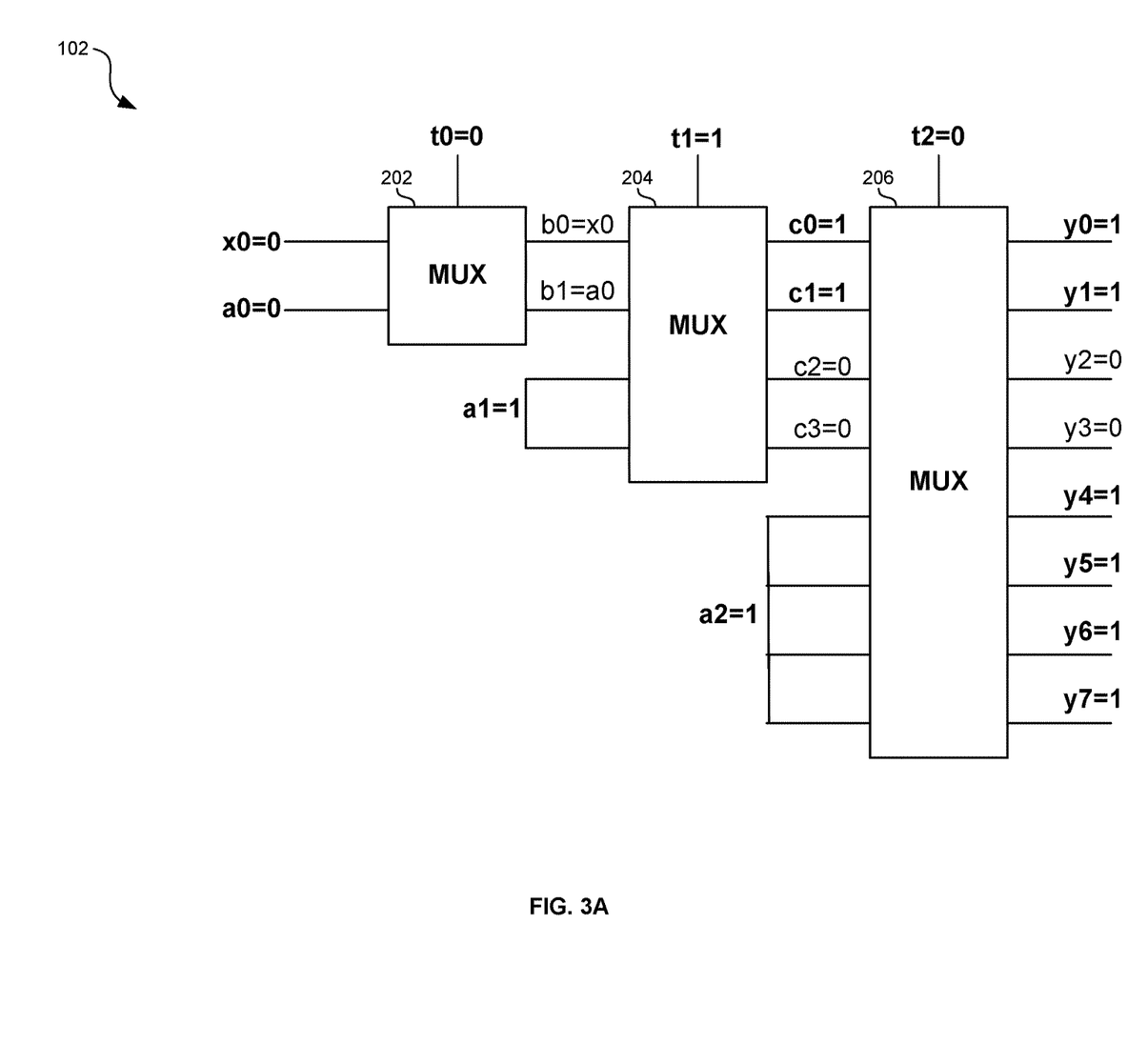
FIGS. 3A-3B illustrate different example configurations of the dynamic element matching circuit of FIG. 2.
Figure 3B:
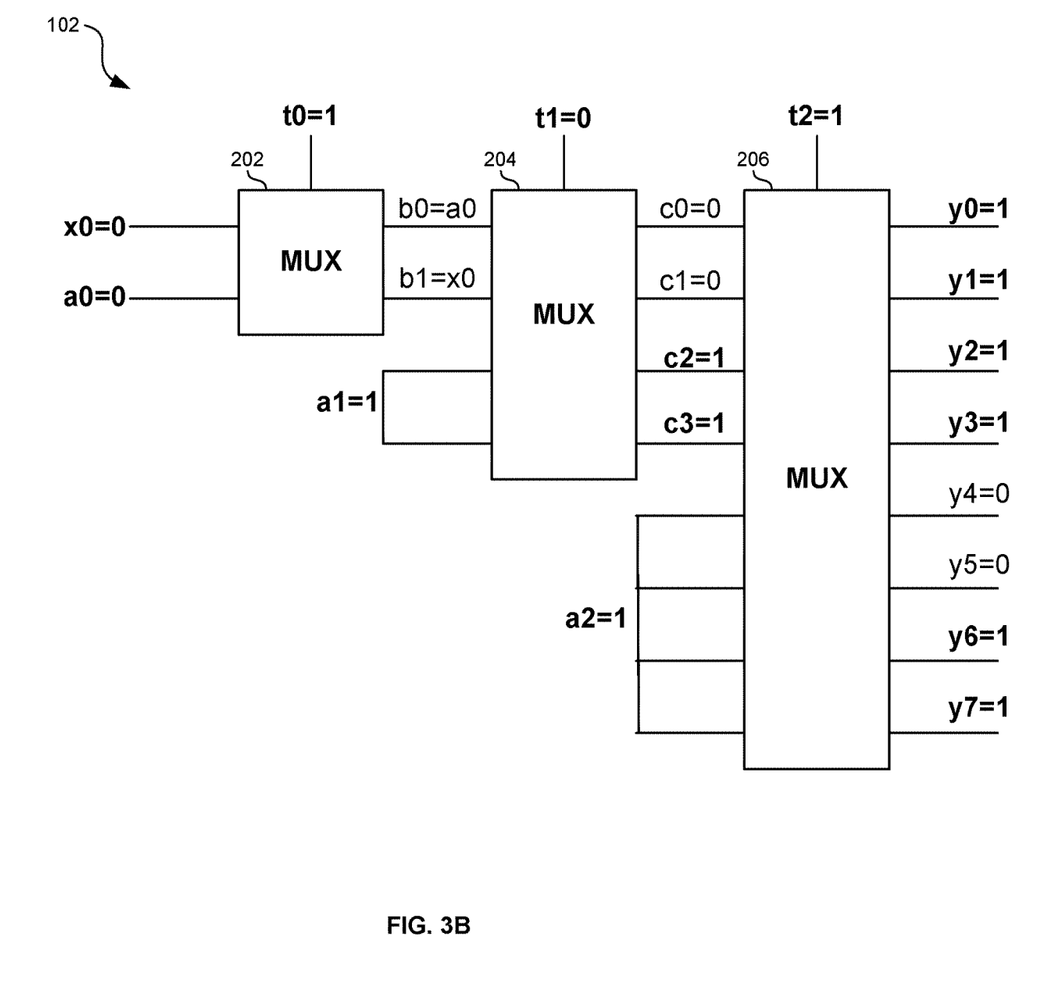

FIGS. 3A-3B illustrate different example configurations of the dynamic element matching circuit of FIG. 2.

In FIG. 3A, a control value of '010' results in input word value of '110' being converted to output word value of '11110011'. In FIG. 3B, a control value of '101' results in input word value of '110' being converted to an output word value of '11001111'. Thus, in FIG. 3B the input word is the same, but the control bits are different, thus shuffling the location of the two 0s in the output word.

Figure 3C:
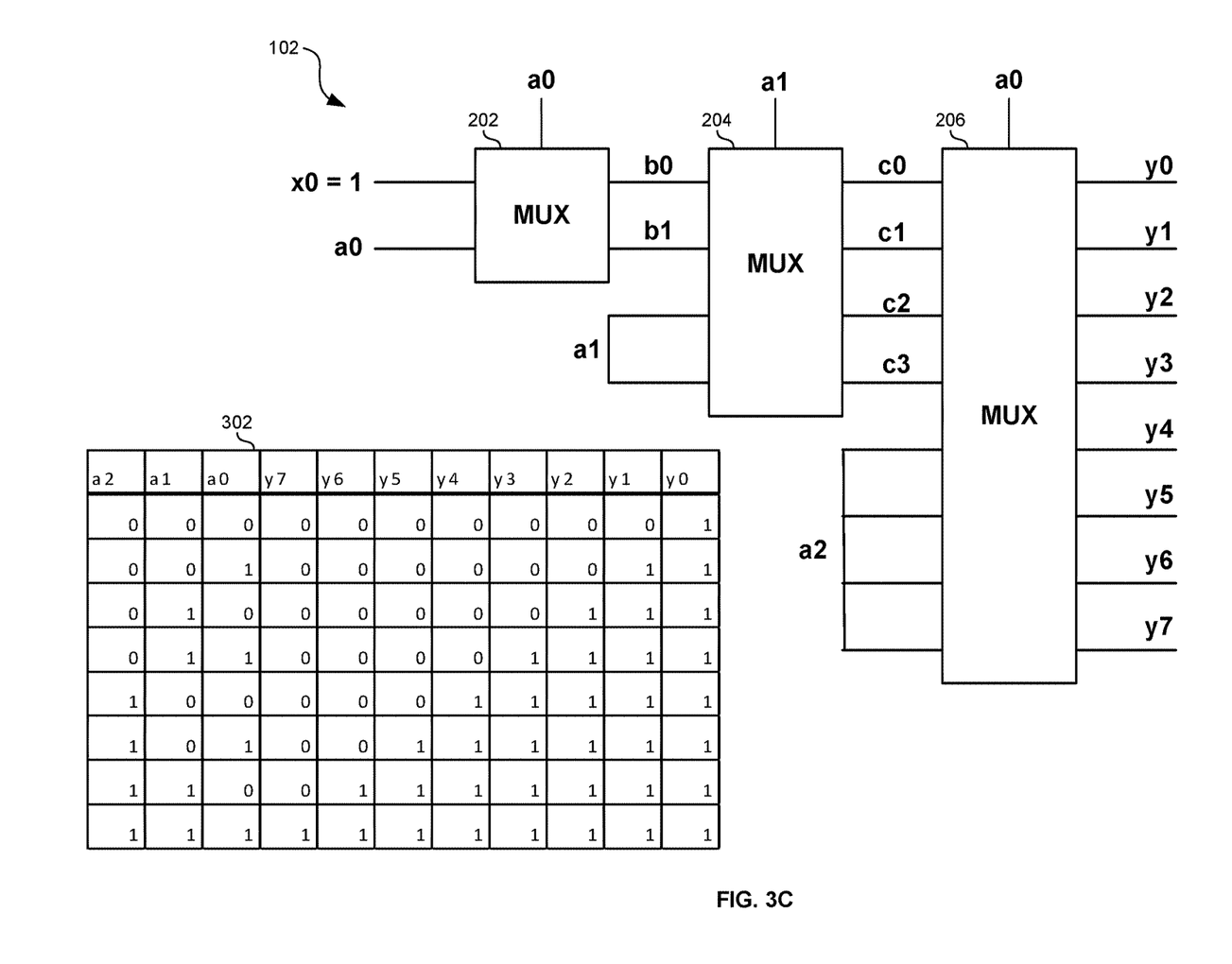
FIG. 3C illustrates binary to thermometer conversion via the circuit of FIG. 2.

In an example implementation, x0 is mode select signal 125. As shown in FIG. 3C, setting x0='1' configures the DEM circuit 102 to convert the 3-bit binary word a2-a0 to an 8-bit thermometer-coded word y7-y0, as shown in table 302.

In accordance with an example implementation, a system comprises an input shuffling circuit (e.g., 102) and digital-to-analog conversion circuitry (e.g., 104). The input shuffling circuit comprises a data input (e.g., 134), a data output (e.g., 138), and a mode control input (e.g., 132) and shuffle ctrl input (e.g., 136). The input shuffling circuit is operable to receive, via the data input, an N-bit binary value (e.g., 121), wherein N is an integer. The input shuffling circuit is operable to route each of the N bits of the N-bit binary word to one or more of M bits of the data output to generate an M-bit value (e.g., of signal 103), wherein $M=2^N$, and the routing is based on a control value (e.g., 123) applied to the control input. The digital-to-analog conversion circuitry is operable to convert the M-bit value to a corresponding analog voltage and/or current (e.g., 105). M different values of the control value may result in M different routings of the N bits of the binary word. The input shuffling circuit may comprise a plurality of multiplexers (e.g., 202, 204, and 206). The input shuffling circuit may comprise a two-to-two multiplexer (e.g., 202), a four-to-four multiplexer (e.g., 204), and an eight-to-eight multiplexer (e.g., 206) so on depending upon N. The two outputs of the two-to-two multiplexer may be connected to two of the four inputs of the four-to-four multiplexer. The four outputs of the four-to-four multiplexer are connected to four of the inputs of the eight-to-eight multiplexer. One bit of the N-bit value (e.g., a0) may be connected to one of the inputs of the two-to-two multiplexer, one bit of the N-bit value (e.g., a1) may be connected to two of the inputs of the four-to-four multiplexer. One bit of the N-bit value (e.g., a2) may be connected to four of the inputs of the eight-to-eight multiplexer. The input shuffling circuit may comprise a mode select input (e.g., 132), and a value applied to the mode select input may control a mode of operation of the input shuffling circuit. A first value (e.g., digital '1') applied to the mode select input may configure the input shuffling circuit in to a dynamic element matching mode and a second value (e.g., digital '0') applied to the mode select input may configure the input shuffling circuit into a binary-to-thermometer conversion mode. The control value may be a N-bit binary word which, in dynamic element matching mode, may be generated from a pseudorandom number generator (e.g., 402) that updates this word at input data rate (i.e., a different control value is used for each successive value of the N-bit binary value to be converted).

As utilized herein the terms "circuits" and "circuitry" refer to physical electronic components (i.e. hardware) and any software and/or firmware ("code") which may configure the hardware, be executed by the hardware, and or otherwise be associated with the hardware. As used herein, for example, a particular processor and memory may comprise a first "circuit" when executing a first one or more lines of code and may comprise a second "circuit" when executing a second one or more lines of code. As utilized herein, "and/or" means any one or more of the items in the list joined by "and/or". As an example, "x and/or y" means any element of the three-element set { (x), (y), (x, y)}. In other words, "x and/or y" means "one or both of x and y". As another example, "x, y, and/or z" means any element of the seven-element set { (x), (y), (z), (x, y), (x, z), (y, z), (x, y, z)}. In other words, "x, y and/or z" means "one or more of x, y and z". As utilized herein, the term "exemplary" means serving as a non-limiting example, instance, or illustration. As utilized herein, the terms "e.g.," and "for example" set off lists of one or more non-limiting examples, instances, or illustrations. As utilized herein, circuitry is "operable" to perform a function whenever the circuitry comprises the necessary hardware and code (if any is necessary) to perform the function, regardless of whether performance of the function is disabled or not enabled (e.g., by a user-configurable setting, factory trim, etc.). As used herein, the term "based on" means "based at least in part on." For example, "x based on y" means that "x" is based at least in part on "y" (and may also be based on z, for example).

Other embodiments of the invention may provide a non-transitory computer readable medium and/or storage medium, and/or a non-transitory machine readable medium and/or storage medium, having stored thereon, a machine code and/or a computer program having at least one code section executable by a machine and/or a computer, thereby causing the machine and/or computer to perform the processes as described herein.

Accordingly, the present invention may be realized in hardware, software, or a combination of hardware and software. The present invention may be realized in a centralized fashion in at least one computing system, or in a distributed fashion where different elements are spread across several interconnected computing systems. Any kind of computing system or other apparatus adapted for carrying out the methods described herein is suited. A typical combination of hardware and software may be a general-purpose computing system with a program or other code that, when being loaded and executed, controls the computing system such that it carries out the methods described herein.

Another typical implementation may comprise an application specific integrated circuit or chip.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A system comprising:
an input shuffling circuit comprising a data input, a data output, a mode select input, and a shuffle control input wherein the input shuffling circuit is operable to:
receive, via the data input, an N-bit binary value, wherein N is an integer; and
route each of the N bits of the N-bit binary value to one or more of M bits of the data output to generate an M-bit value, wherein $M=2^N$, and the route is based on a control value applied to the mode select input; and
digital-to-analog conversion circuitry operable to convert the M-bit value to a corresponding analog voltage and/or current.

2. The system of claim 1, wherein M different values applied to the shuffle control input result in M different routings of the N bits of the binary value.

3. The system of claim 1, wherein the input shuffling circuit comprises a plurality of multiplexers.

4. The system of claim 1, wherein the input shuffling circuit comprises a two-to-two multiplexer, a four-to-four multiplexer, and an eight-to-eight multiplexer.

5. The system of claim 4, wherein:
two outputs of the two-to-two multiplexer are connected to two of four data inputs of the four-to-four multiplexer; and
four outputs of the four-to-four multiplexer are connected to four of eight data inputs of the eight-to-eight multiplexer.

6. The system of claim 5, wherein:
one bit of the N-bit value is connected to one of two data inputs of the two-to-two multiplexer;
one bit of the N-bit value is connected to two of four data inputs of the four-to-four multiplexer; and
one bit of the N-bit value is connected to four of eight data inputs of the eight-to-eight multiplexer.

7. The system of claim 1, wherein the route is based on a value applied to the shuffle select input.

8. The system of claim 1, wherein:
a first value applied to the mode select input configures the input shuffling circuit into a dynamic element matching mode; and
a second value applied to the mode select input configures the input shuffling circuit into a binary-to-thermometer conversion mode.

9. The system of claim 1, wherein:
a first value applied to the mode select input configures the input shuffling circuit into a dynamic element matching mode; and
a second value applied to the mode select input configures the input shuffling circuit into a binary-to-thermometer conversion mode.

10. A method comprising:
in a system comprising digital-to-analog conversion circuitry and an input shuffling circuit comprising a data input, a data output, mode select input, and a shuffle control input:
receiving, by the input shuffling circuit via the data input, an N-bit binary value, where N is an integer;
generating, by the input shuffling circuit, an M-bit value by routing each of the N bits of the N-bit binary value to one or more of M bits of the data output, where $M=2^N$, and the routing is based on a value applied to the mode select input; and
converting, by the digital-to-analog conversion circuitry, the M-bit value to
a corresponding analog voltage and/or current.

11. The method of claim 10, wherein M different values applied to the shuffle control input result in M different routings of the N bits of the binary value.

12. The method of claim 10, wherein the input shuffling circuit comprises a plurality of multiplexers.

13. The method of claim 10, wherein the input shuffling circuit comprises a two-to-two multiplexer, a four-to-four multiplexer, and an eight-to-eight multiplexer.

14. The method of claim 13, wherein:
two outputs of the two-to-two multiplexer are connected to two of four data inputs of the four-to-four multiplexer; and
four outputs of the four-to-four multiplexer are connected to four of eight data inputs of the eight-to-eight multiplexer.

15. The method of claim 14, wherein:
one bit of the N-bit value is connected to one of two data inputs of the two-to-two multiplexer;
one bit of the N-bit value is connected to two of four data inputs of the four-to-four multiplexer; and
one bit of the N-bit value is connected to four of eight data inputs of the eight-to-eight multiplexer.

16. The method of claim 10, wherein the route is based on a value applied to the shuffle control input.

17. The method of claim 10, comprising:
selecting a dynamic element matching mode when a first value is applied to the mode select input; and
selecting a binary-to-thermometer conversion mode when a second value is applied to the mode select input.

18. The method of claim 10, comprising:
configuring the input shuffling circuit into a dynamic element matching mode when a first value is applied to the mode select input; and
configuring the input shuffling circuit into a binary-to-thermometer conversion mode when a second value is applied to the mode select input.

19. The method of claim 10, comprising varying, over time, a value applied to the shuffle control input.

20. The method of claim 19, wherein the value applied to the shuffle control input is a pseudo-random N-bit value that varies at an input rate of the N-bit binary value.

* * * * *